United States Patent

Kato

[11] Patent Number: 5,913,689
[45] Date of Patent: Jun. 22, 1999

[54] MALE CONNECTION FOR JUNCTION BOX

[75] Inventor: Shinshu Kato, Yokkaichi, Japan

[73] Assignee: Sumitomo Wiring Systems, Ltd., Japan

[21] Appl. No.: 09/002,715

[22] Filed: Jan. 5, 1998

[30]   Foreign Application Priority Data

Jan. 7, 1997 [JP] Japan .................................. 9-000696

[51] Int. Cl.⁶ .................................................. H01R 9/09
[52] U.S. Cl. ........................................ 439/76.2; 439/949
[58] Field of Search ................... 439/76.2, 949, 439/571, 572

[56]          References Cited

U.S. PATENT DOCUMENTS

| | | | |
|---|---|---|---|
| 4,781,621 | 11/1988 | Sugiyama et al. | 439/76.2 |
| 5,023,752 | 6/1991 | Detter et al. | 439/76.2 |
| 5,490,794 | 2/1996 | Kobayashi et al. | 439/212 |
| 5,516,301 | 5/1996 | Kawakita | 439/206 |
| 5,522,730 | 6/1996 | Soes et al. | 439/572 |

FOREIGN PATENT DOCUMENTS

| | | |
|---|---|---|
| 0130844 | 1/1985 | European Pat. Off. . |
| 0388058 | 9/1990 | European Pat. Off. . |
| 62-177226 | 11/1987 | Japan . |
| 63-120522 | 8/1988 | Japan . |

*Primary Examiner*—Steven L. Stephan
*Assistant Examiner*—T. C Patel
*Attorney, Agent, or Firm*—Jordan B. Bierman; Bierman, Muserlian and Lucas

[57]          ABSTRACT

The male connector used in an electrical junction box employs a guide rib which is disposed perpendicular to the long side of an enclosing rib which encircles the male tab opening. The guide rib, positioned on both long sides of the enclosing rib, guides the tab into the male tab opening in order to prevent damage which occurs when there is misalignment of the tab with the male tab opening. In order to further assist in the realignment of the tab with the male tab opening, the surfaces of the enclosing rib and the guiding rib are sloped towards the male tab opening to allow the tab to be guided into the male tab opening during assembly of the junction box.

12 Claims, 6 Drawing Sheets

MALE CONNECTION FOR JUNCTION BOX

This Application claims the benefit of the priority of Japanese 9-696, filed Jan. 7, 1997.

The present Invention relates to an electrical junction box used for connecting wire harnesses in motor vehicles and, more particularly, to an improvement in the male connector portion of the junction box.

BACKGROUND OF THE INVENTION

Normally, an electrical junction box, also referred to as a junction block, a relay block, a branch joint box, etc., is formed by assembling a busbar substrate inside an upper and lower case. The busbar substrate comprises a series of busbars which are insulated from one another by an insulating substrate. Typically, the insulating substrate has insulating ribs for separating and providing insulation between the individual busbars. The insulating substrate has male tab openings through which the busbars' tabs extend in order to make connections between the respective busbars. The busbars also have tabs which project away from the insulating substrate and extend through male tab openings in the upper or lower casing to form male connectors. The male connectors in the upper and lower casing provide terminal ends for connection to the wiring harnesses in the motor vehicle.

FIG. 1 illustrates a conventional electrical junction box 101 having upper casing 102 and lower casing 103. Male connector 110 includes connector enclosure 104 formed on upper casing 102. Inside connector cavity 104 is a plurality of male tab openings 105. Housed between upper casing 102 and lower casing 103 is busbar substrate 106. Busbar substrate 106 comprises busbars 107 and insulating substrate 108. Busbars 107 form a prescribed circuit while insulating substrate 108 provides insulation between the busbars. At the ends of busbars 107 are tabs 109. Tabs 109 have sloping surfaces 109a (see FIG. 2) in order to facilitate mating.

Tab 109 passes through male tab opening 105 and into connector cavity 104 during assembly of junction box 101. Insulating rib 111 is formed on insulating substrate 108 to provide insulation between individual busbars 107. Tab openings 112 allow tabs 109 to pass through substrate 108.

In order to assemble junction box 101, the chuck (not shown) of an automatic assembling machine grasps busbar substrate 106 and mounts it inside lower casing 103. Then upper casing 102 is attached to lower casing 103, thereby completing the assembly of junction box 101. When upper casing 102 is attached to lower casing 103, tabs 109 pass through male tab openings 105 to form the male connector 110.

FIG. 2 shows a schematic cross section of the male connector 110 of a conventional junction box. Height L1 of insulating rib 111 is greater than height L2 of busbar 107. When condensation or the like forms within upper casing 102, short circuiting between the individual busbars 107 is prevented due to the fact that insulating rib 111 has height L1 which prevents droplets of water or dew from passing between the individual busbars 107.

Since height L1 of insulating rib 111 is greater than height L2 of busbar 107, there is a gap between busbar 107 and the bottom of upper casing 102 when tab 109 is passed through male tab opening 105. In order to stabilize tab 109 within male tab opening 105 and close this gap, enclosing rib 113 is formed around male tab opening 105. Enclosing rib 113 is formed integrally with the bottom of upper casing 102. Enclosing rib 113 presses down upon busbar 107 to securely hold busbar 107 in male tab opening 105. A bottom view of upper casing 102 is shown in FIG. 3a wherein male tab opening is encircled by enclosing rib 113.

It has been found that, during the assembly of the junction box, the alignment between male tab openings 105 and tabs 109 can be missed. This misalignment is depicted in FIG. 3b and can cause deformation in tab 109 resulting in busbar substrate 106 or upper casing 102 being damaged or destroyed. As will be appreciated by those skilled in the art, the assembly and description with respect to the misalignment that occurs with respect to upper casing 102, also occurs with respect to lower casing 103 in that in lower casing 103 also has male connector 110 along with enclosing rib 113.

SUMMARY OF THE INVENTION

The present Invention solves the above mentioned problems by providing a guide rib disposed on the enclosed rib in order to guide a misaligned tab into the male tab opening. The guide rib extends out from the long side of the enclosing rib. Preferably, the guide rib is disposed perpendicular to the long side of the enclosing rib and is aligned with the middle portion of the male tab opening. It is also preferred that the height of the guide rib is the same as the height of the enclosing rib.

It is also preferred that the present Invention employ a sloping surface on the upper surface of the enclosing rib which is sloped towards the male tab opening. The sloping surface also assists in guiding the misaligned tab into the male tab opening. It is more preferred that the sloping surface be continuous from the inner surface of the enclosing rib, i.e. the surface of the enclosing rib adjacent to the male tab opening, to the end of the guide rib. The sloping surface directs a tab which is misaligned and intersects any portion of either the guide rib or enclosing rib to the male tab opening.

It is preferred that the arrangement of the male connector be employed, not only on the upper casing, but also on the lower casing.

The height of the insulating rib of the insulating substrate is preferably greater than the height of the busbar. The guide rib and the enclosing rib make contact with the busbar in order to stabilize the busbar in the male connector while solving the misalignment problem in the prior art.

BRIEF DESCRIPTION OF THE DRAWINGS

In the accompanying drawings, constituting a part hereof, and in which like reference characters indicate like parts.

DETAILED DESCRIPTION OF THE INVENTION

Figure 1:
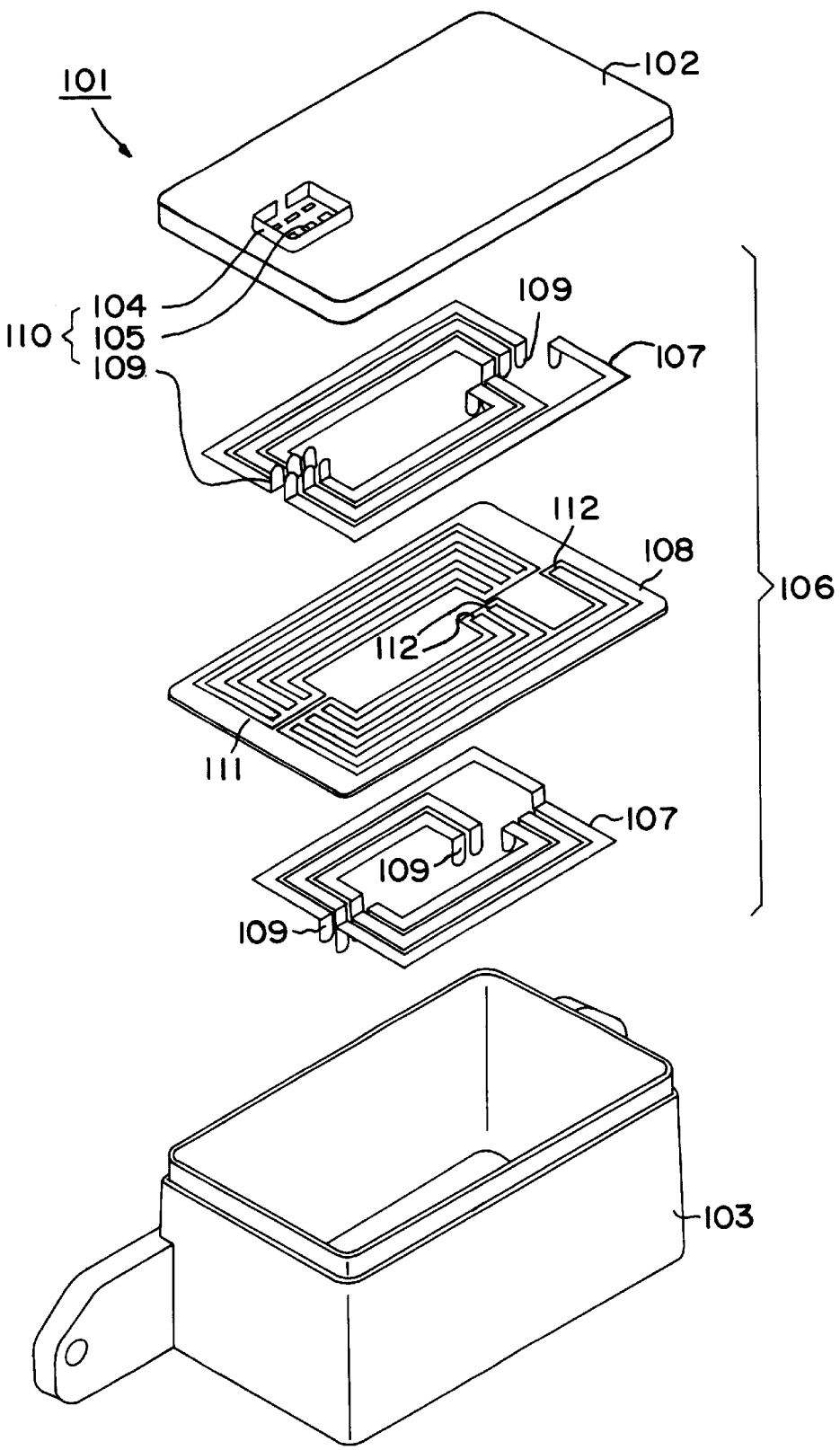
FIG. 1 illustrates a conventional junction box.
Figure 2:
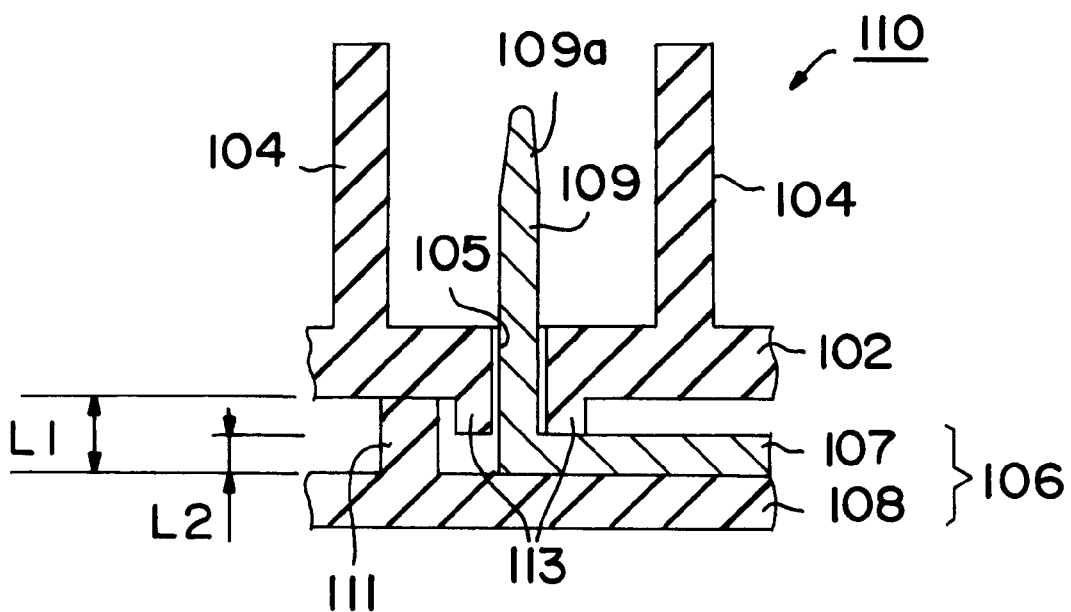
FIG. 2 illustrates a conventional male connector.
Figure 3A:
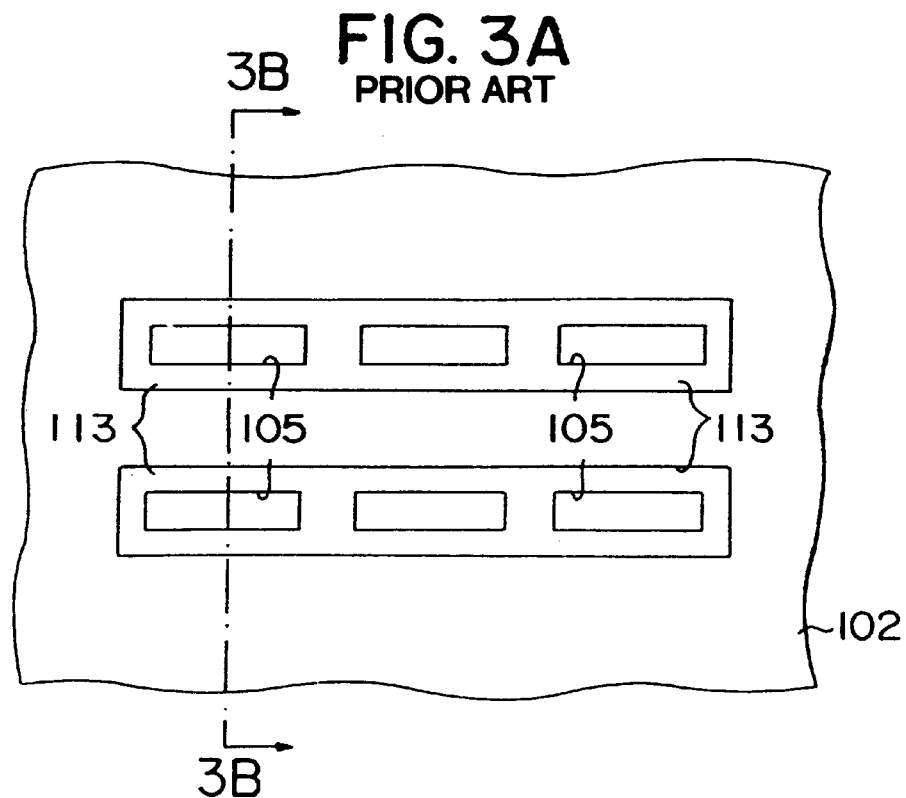
FIG. 3a illustrates the bottom of a conventional upper casing employing enclosing ribs.
Figure 3B:
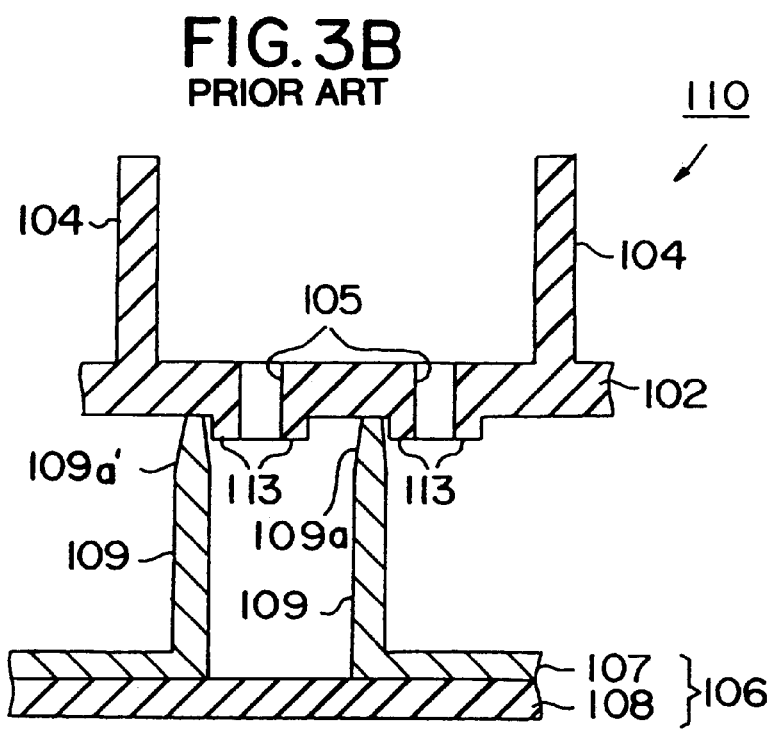
FIG. 3b is a cross section taken along lines 3B—3B of FIG. 3a illustrating misalignment of the tabs during assembly in a conventional junction box.
Figure 4:
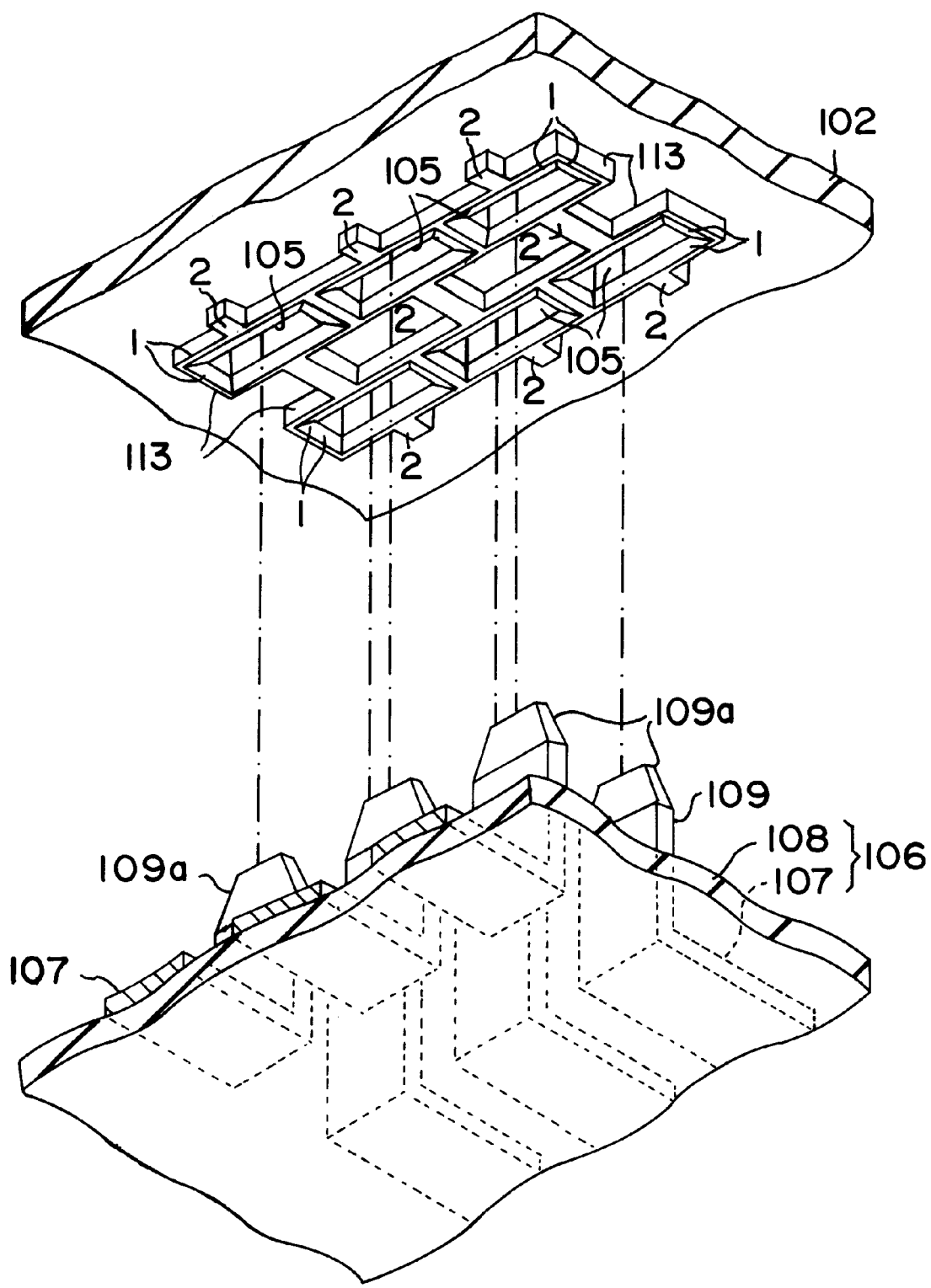
FIG. 4 illustrates the present Invention.

Referring to FIG. 4, guide rib 2 is disposed on enclosing rib 113. The parts that are identical to those elements already described with respect to FIGS. 1–3 have been given like reference numerals. Also shown in FIG. 4 is sloped surface 1 of enclosing rib 113. This sloping surface 1 of closing rib 113 is also depicted in FIG. 5a.

Figure 5A:
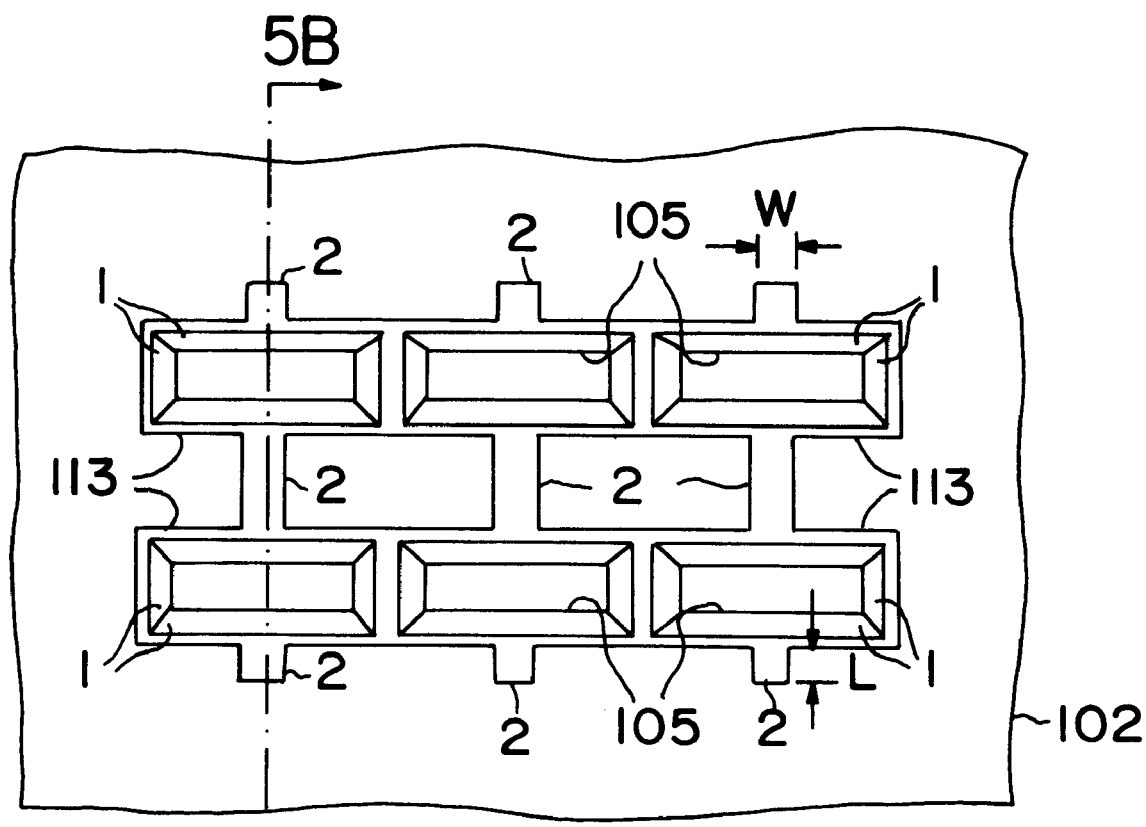
FIG. 5a illustrates the bottom of the upper casing employing the present Invention.

As shown in FIGS. 4 and 5a, sloping surfaces 1 are formed on the upper surfaces of enclosing ribs 113. Sloping surfaces 1 are sloped towards male tab openings 105. Guide ribs 2 are disposed on the long sides of enclosing ribs 113 in a direction perpendicular thereto. The heights of guide ribs 2 are the same as the heights of enclosing ribs 113. Both the heights of guide ribs 2 and enclosing ribs 113 are less than the height of insulating ribs 111, not shown in FIGS. 4 and 5. As can be seen in FIG. 4, guide ribs 2 are disposed on the long sides (and essentially in the center portions) of male tab openings 105.

Preferably, width W of guide rib 2 is 0.5 to 4.0 mm. If it is less than 0.5, guide rib 2 may be weak and the molding resin may not flow sufficiently to mold enclosing rib 113. If W is more 4.0, anomalies, such as extra resin, in the product may occur. It is advantageous to make length L of guide rib 2 from 0.5 to 3.0 mm. If the rib is below the minimum, it may have difficulty in acting as a guide. If it is larger than 3.0 mm, it may interfere with other circuits.

Figure 5B:
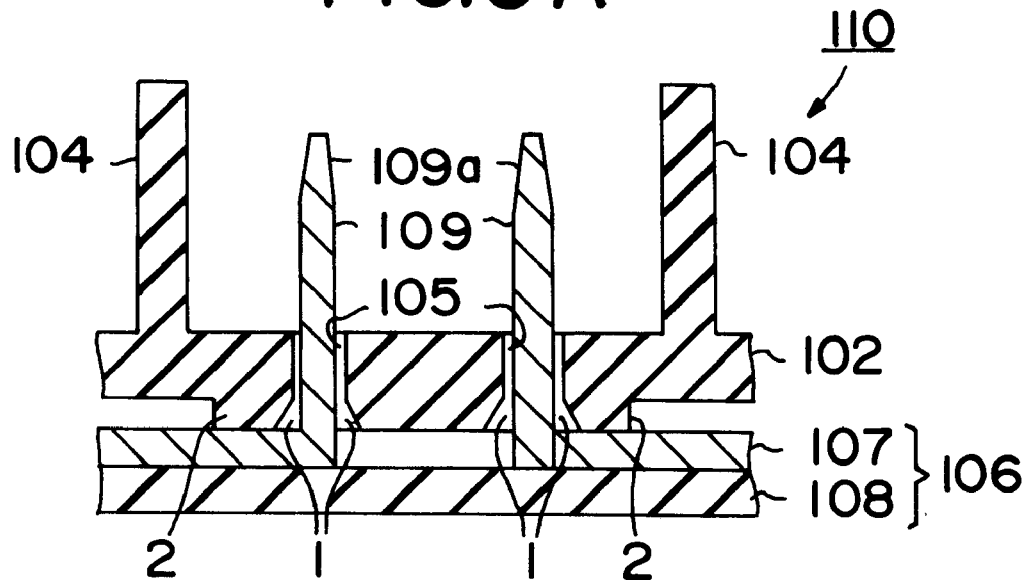
FIG. 5b is a cross section along lines 5B—5B of FIG. 5a showing tabs inserted through the upper casing.

As shown in FIG. 5b, when tabs 109 pass through male tab openings 105, sloped ends 109a contact sloped surfaces 1 of enclosing ribs 113, and are thereby guided into male openings 105. Since the heights of guide ribs 2 are the same as the heights of enclosing ribs 113, sloped ends 109a move smoothly from guide ribs 2 to enclosing ribs 113 to allow tabs 109 to reach sloping surfaces 1. This interaction between guide ribs 2, enclosing ribs 113 and tabs 109 allows for a smooth insertion of tab 109 into male tab opening 105.

As can be appreciated by one skilled in the art, tab 109 is reliably guided to male tab opening 105 even if there is misalignment between tab 109 and male tab opening 105. By this means, the deformation that had previously been experienced by tab 109 and the damage to upper casing 102 are prevented through the interaction of guide ribs 2 and, the preferable, sloping surfaces 1. Hence, the number of damaged junction boxes will be decreased because of the realignment of tabs 109 into male tab openings 105 by guide ribs 2 in accordance with the present Invention. It will also be appreciated that guide ribs 2 reinforce enclosing ribs 113 and thereby prevent them from being damaged or breaking during misalignment of tabs 109 with male tab openings 105.

Figure 6A:
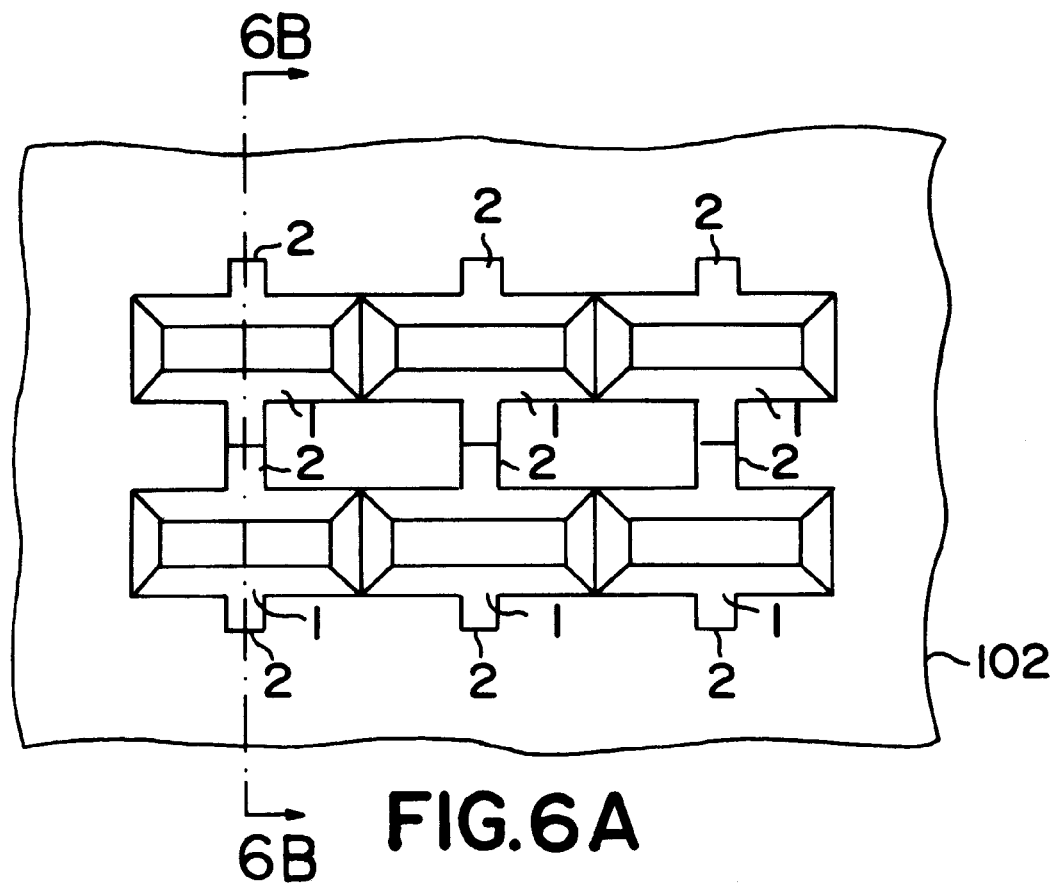
FIG. 6a illustrates the bottom of the upper casing employing a preferred embodiment of the present Invention.
Figure 6B:
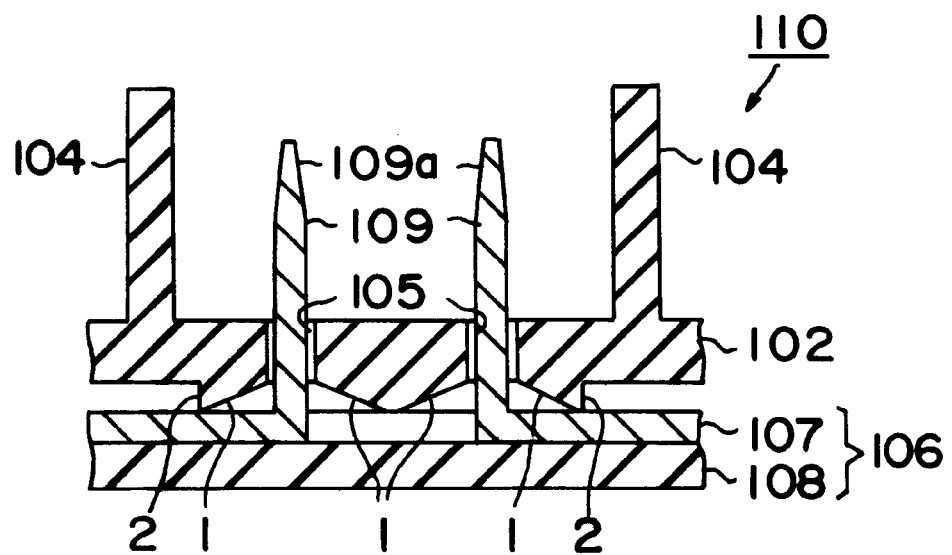
FIG. 6b illustrates a preferred embodiment of the present Invention shown in FIG. 6a taken along line 6B—6B wherein tabs have been inserted through the upper casing.

Turning to FIGS. 6a and 6b, sloping surfaces 1 are continuously disposed from the inside surfaces of enclosing ribs 113 to the ends of guide rib 2. As will be appreciated, having continuous sloping surfaces on both enclosing ribs 113 and guide ribs 2, permits a smooth entry of tabs 109 into male tab openings 105.

It will be understood by those skilled in the art that guide ribs 2 can be disposed at any angle relative to the long sides of enclosing ribs 113, they do not have to be perpendicular. However, for best results, it has been found that guide ribs 2 should be perpendicular to enclosing ribs 113 along the long sides thereof. It also should be noted from the Figures herein that guide ribs 2 are disposed on both long sides of enclosing ribs 113.

While only a limited number of specific embodiments of the present invention have been expressly disclosed, it is, nonetheless, to be broadly construed, and not to be limited except by the character of the clams appended hereto.

What we claim is:

1. A male connector comprising:

a connector enclosure defining a cavity, said cavity having a floor;

a male tab opening extending through said floor;

an enclosing rib disposed around a perimeter of said male tab opening on a first side of said floor;

a guide rib disposed on said first side of said floor and connected at at least one end to said enclosing rib, said guide rib being perpendicular to an intersecting with a long side of said enclosing rib; and a tab passing through said male tab opening extending from a second side of said floor, opposite said first side, said guide rib guiding said tab through said male tab opening and providing reinforcement to said enclosing rib.

2. The male connector of claim 1 wherein:

a height of said guide rib and a height of said enclosing rib are the same.

3. The male connector of claim 1 wherein:

said enclosing rib has a sloped surface toward said male tab opening.

4. The male connector of claim 1 wherein:

said enclosing rib has a sloped surface continuously sloping from inside of said enclosing rib to said male tab opening.

5. The male connector of claim 4 wherein said guide rib has a sloped surface continuously sloping towards said male tab opening.

6. The male connector of claim 1 wherein a width of said guide rib, in a direction parallel to a long side of said enclosing rib, is 0.5 to 4.0 mm.

7. The male connector of claim 1 wherein a length of said guide rib, perpendicular to a long side of said enclosing rib, is 0.5 to 3.0 mm.

8. A junction box comprising:

an upper case;

a lower case;

a busbar on which is formed a tab;

a male connector on either said upper case or said lower case, said male connector comprising a connector enclosure defining a cavity having a floor;

a male tab opening extending through said floor;

an enclosing rib disposed around a perimeter of said male tab opening on a first side of said floor;

a guide rib disposed on said first side of said floor and connected at at least one end to said enclosing rib, said guide rib being perpendicular to and intersecting with a long side of said enclosing rib; and a tab passing through said male tab opening extending from a second side of said floor, opposite said first side, said guide rib guiding said tab through said male tab opening and providing reinforcement to said enclosing rib.

9. The junction box of claim 8 wherein:

said box has two busbars;

an insulating rib is disposed between said busbars to provide insulation; and a busbar substrate is formed on said insulating rib so that said insulating rib has a height greater than a height of said busbars.

10. The junction box of claim 9 wherein said insulating rib has a height greater than the height of either said enclosing rib or said guide rib.

11. The junction box of claim 6 wherein a width of said guide rib, in a direction parallel to a long side of said enclosing rib is 0.5 to 4.0 mm.

12. The junction box of claim 6 wherein a length of said guide rib, in a direction perpendicular to a long side of said enclosing rib, is 0.5 to 3.0 mm.

* * * * *